US011978661B2

(12) United States Patent
Al-Amoody et al.

(10) Patent No.: US 11,978,661 B2
(45) Date of Patent: May 7, 2024

(54) ULTRALOW-K DIELECTRIC-GAP WRAPPED CONTACTS AND METHOD

(71) Applicant: GLOBALFOUNDRIES U.S. Inc., Malta, NY (US)

(72) Inventors: Fuad H. Al-Amoody, Colchester, VT (US); Felix P. Anderson, Colchester, VT (US); Spencer H. Porter, Colchester, VT (US); Mark D. Levy, Williston, VT (US); Siva P. Adusumilli, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 221 days.

(21) Appl. No.: 17/118,697

(22) Filed: Dec. 11, 2020

(65) Prior Publication Data

US 2022/0189818 A1 Jun. 16, 2022

(51) Int. Cl.
*H01L 21/768* (2006.01)
*H01L 23/522* (2006.01)
*H01L 23/528* (2006.01)
*H01L 29/417* (2006.01)
*H01L 23/532* (2006.01)

(52) U.S. Cl.
CPC .... *H01L 21/7682* (2013.01); *H01L 21/76843* (2013.01); *H01L 21/76846* (2013.01); *H01L 21/76856* (2013.01); *H01L 21/76865* (2013.01); *H01L 23/5226* (2013.01); *H01L 29/41725* (2013.01); *H01L 23/5283* (2013.01); *H01L 23/53295* (2013.01)

(58) Field of Classification Search
CPC ......... H01L 29/41725; H01L 21/76829; H01L 21/76843; H01L 21/76865; H01L 21/7682
See application file for complete search history.

(56) References Cited

U.S. PATENT DOCUMENTS

| 6,472,266 | B1 | 10/2002 | Yu et al. |
| 8,241,991 | B2 | 8/2012 | Hsieh et al. |
| 9,159,609 | B2 | 10/2015 | Lee et al. |
| 9,202,774 | B2 * | 12/2015 | Yeom .................. H10B 12/315 |
| 9,412,659 | B1 * | 8/2016 | Zang ..................... H01L 27/088 |
| 9,484,250 | B2 | 11/2016 | Leobandung |
| 10,164,029 | B2 * | 12/2018 | Chang .............. H01L 29/41775 |
| 10,319,680 | B1 | 6/2019 | Sel et al. |
| 10,490,444 | B2 | 11/2019 | Choi et al. |

(Continued)

*Primary Examiner* — Daniel Luke
(74) *Attorney, Agent, or Firm* — Anthony Canale; Hoffman Warnick LLC

(57) ABSTRACT

Disclosed is a structure with ultralow-K (ULK) dielectric-gap wrapped contact(s). The structure includes an opening, which extends through a dielectric layer and is aligned above a device. A contact is within the opening and electrically connected to the device. Instead of the contact completely filling the opening, a ULK dielectric-gap (e.g., an air or gas-filled gap or a void) at least partially separates the contact from the sidewall(s) of the contact opening and further wraps laterally around the contact. Also disclosed is a method for forming the structure and, particularly, for forming a ULK dielectric-gap by etching back an exposed top end of an adhesive layer initially lining a contact opening to form a gap between the sidewall(s) of the opening and the contact and then capping the gap with an additional dielectric layer such that the gap is filled with air or gas or is under vacuum.

20 Claims, 16 Drawing Sheets

(56) References Cited

U.S. PATENT DOCUMENTS

| | | |
|---|---|---|
| 10,923,565 B2* | 2/2021 | Lee ....................... H01L 27/088 |
| 11,328,982 B2* | 5/2022 | Wu ....................... H01L 23/485 |
| 11,456,383 B2* | 9/2022 | Liu ................. H01L 21/823807 |
| 11,551,968 B2* | 1/2023 | Hsueh ................. H01L 23/5329 |
| 2016/0329337 A1 | 11/2016 | Hwang et al. |
| 2018/0047615 A1 | 2/2018 | Cheng et al. |
| 2019/0206740 A1 | 7/2019 | Shroff et al. |
| 2019/0385896 A1* | 12/2019 | Chiang ............... H01L 29/4991 |
| 2020/0075715 A1 | 3/2020 | Xie et al. |
| 2021/0050412 A1* | 2/2021 | Wong ................ H01L 21/76843 |
| 2021/0134743 A1* | 5/2021 | Lai ..................... H01L 23/5226 |

* cited by examiner

ULTRALOW-K DIELECTRIC-GAP WRAPPED CONTACTS AND METHOD

BACKGROUND

Field of the Invention

The present invention relates to contacts in integrated circuits (ICs) and, more particularly, to embodiments of an IC structure with contact(s) configured to reduce parasitic capacitance and a method of forming the IC structure.

Description of Related Art

Integrated circuit (IC) design decisions are often driven by device scalability, device density, manufacturing efficiency, and costs. As device sizes continue to be reduced and device density continues to be increased, energy loss due to parasitic capacitance associated with the device contacts (e.g., parasitic contact-to-contact capacitance ($C_{CA-CA}$), parasitic contact-to-gate capacitance ($C_{CA-G}$), etc.) can be a significant contributor to total energy loss. Thus, it would be advantageous to provide an IC structure that has reduced parasitic capacitance associated with the contacts.

SUMMARY

In view of the foregoing, disclosed herein are embodiments of an integrated circuit (IC) structure with one or more ultralow-K (ULK) dielectric-gap wrapped contacts for reduced parasitic capacitance. Specifically, the IC structure can include a device (e.g., a transistor or some other type of device) and a dielectric layer on the device. A contact opening can extend through the dielectric layer and a contact can be within the contact opening such that it is electrically connected to the device. However, instead of the contact completely filling the contact opening, a ULK dielectric-gap can at least partially separate the contact from the sidewall(s) of the contact opening (e.g., can wrap laterally around the contact within the contact opening). The ULK dielectric-gap can be, for example, an air-gap, a gas-filled gap, or a void (i.e., a space under vacuum). Also disclosed herein are embodiments of a method for forming such an IC structure and, particularly, for forming the ULK dielectric-gap within the contact opening by etching back a top end of an adhesive layer initially lining the entire contact opening to form a gap and then capping the gap with an additional dielectric layer such that the gap becomes an air-filled gap (i.e., an air-gap), a gas-filled gap, or a void (i.e., a space under vacuum).

More particularly, disclosed herein are embodiments of an IC structure. The IC structure can include a substrate and, on the substrate, a device (e.g., an active semiconductor device or a passive semiconductor device). The IC structure can further include a dielectric layer over the device. This dielectric layer can have a contact opening that extends through the dielectric layer. This contact opening can have at least one sidewall. For example, the contact opening can have an essentially round or oval shape such that it has a single continuous sidewall. Alternatively, the contact opening can have a square, rectangular, hexagonal, etc. shape such that it has multiple sidewalls. In any case, the IC structure can further include a contact within the contact opening. This contact can be electrically connected to the device, but at least partially physically separated from the sidewall(s) of the contact opening by an ultralow-K (ULK) dielectric-gap. The ULK dielectric gap can be, for example, an air-filled gap (also referred to herein as an air-gap), a gas-filled gap, or a void (i.e., a space under vacuum).

In exemplary embodiments the disclosed integrated circuit (IC) structure can include a substrate and, on the substrate, a transistor. The transistor can have source/drain regions, a channel region positioned laterally between the source/drain regions, and a gate structure on the channel region. The IC structure can further include a dielectric layer on the transistor. This dielectric layer can have contact openings that are aligned above the source/drain regions and that extend through the dielectric layer. Each of the contact openings can have at least one sidewall. For example, each contact opening can have an essentially round or oval shape such that it has a single continuous sidewall. Alternatively, each contact opening can have a square, rectangular, hexagonal, etc. shape such that it has multiple sidewalls. In any case, the IC structure can further include contacts within the contact openings and electrically connected to the source/drain regions, respectively. Each contact within a given contact opening can, however, be at least partially physically separated from the sidewall(s) of that contact opening by a ULK dielectric-gap (i.e., an air-gap, a gas-filled gap, or a void).

Also disclosed herein are embodiments of a method of forming an integrated circuit (IC) structure. The method can include providing a substrate and forming, on the substrate, a device (e.g., an active semiconductor device or a passive semiconductor device). The method can further include forming a dielectric layer on the device. The method can further include forming a contact opening that extends through the dielectric layer. This contact opening can have at least one sidewall. For example, the contact opening can be formed so as to have an essentially round or oval shape and, thereby one continuous sidewall. Alternatively, the contact opening can be formed so as to have a square, rectangular, hexagonal, etc. shape and, thereby multiple sidewalls. In any case, the method can further include forming a contact within the contact opening such that it is electrically connected to the device, but also at least partially physically separated from the sidewall(s) of the contact opening by an ultralow-K (ULK) dielectric-gap such as an air-filled gap (also referred to herein as an air-gap), a gas-filled gap, or a void (i.e., a space under vacuum).

In exemplary embodiments the method can include providing a substrate and forming a transistor on the substrate such that the transistor has source/drain regions, a channel region positioned laterally between the source/drain regions, and a gate structure on the channel region. The method can further include forming a dielectric layer on the transistor. The method can further include forming contact openings that are aligned above the source/drain regions and that extend through the dielectric layer. Each contact opening can have at least one sidewall. For example, the contact openings can be formed so as to have an essentially round or oval shape and, thereby one continuous sidewall. Alternatively, the contact openings can be formed so as to have a square, rectangular, hexagonal, etc. shape and, thereby multiple sidewalls. In any case, the method can further include forming contacts within the contact openings such that they are electrically connected to the source/drain regions, respectively. Each contact within a given contact opening can, however, be formed so that it is also at least partially physically separated from the sidewall(s) of that contact opening by a ULK dielectric-gap (i.e., an air-gap, a gas-filled gap, or a void).

In the above-described method embodiments formation of each contact can include: initially lining the contact opening with an adhesive layer; depositing a metal fill material for the contact into the contact opening; exposing the top end of the adhesive layer in the contact opening (e.g., by chemical mechanical polishing (CMP)); etching back the exposed top end of the adhesive layer to form a gap between the sidewall(s) of the contact opening and the contact; and capping the gap with an additional dielectric layer such that the gap is any of an air-filled gap (also referred to herein as an air-gap), a gas-filled gap, or a void (i.e., a space under vacuum).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuit (IC) design decisions are often driven by device scalability, device density, manufacturing efficiency, and costs. As device sizes continue to be reduced and device density continues to be increased, energy loss due to parasitic capacitance associated with the device contacts (e.g., parasitic contact-to-contact capacitance ($C_{CA-CA}$), parasitic contact-to-gate capacitance ($C_{CA-G}$), etc.) can be a significant contributor to total energy loss.

In view of the foregoing, disclosed herein are embodiments of an integrated circuit (IC) structure with one or more ultralow-K (ULK) dielectric-gap wrapped contacts for reduced parasitic capacitance. Specifically, the IC structure can include a device (e.g., a transistor or some other type of device) and a dielectric layer on the device. A contact opening can extend through the dielectric layer and a contact can be within the contact opening such that it is electrically connected to the device. However, instead of the contact completely filling the contact opening, a ULK dielectric-gap can at least partially separate the contact from the sidewall(s) of the contact opening (e.g., can wrap laterally around the contact within the contact opening). The ULK dielectric-gap can be, for example, an air-gap, a gas-filled gap, or a void (i.e., a space under vacuum). Also disclosed herein are embodiments of a method for forming such an IC structure and, particularly, for forming the ULK dielectric-gap within the contact opening by etching back a top end of an adhesive layer initially lining the entire contact opening to form a gap and then capping the gap with an additional dielectric layer such that the gap becomes an air-filled gap (i.e., an air-gap), a gas-filled gap, or a void (i.e., a space under vacuum).

Figure 1A:
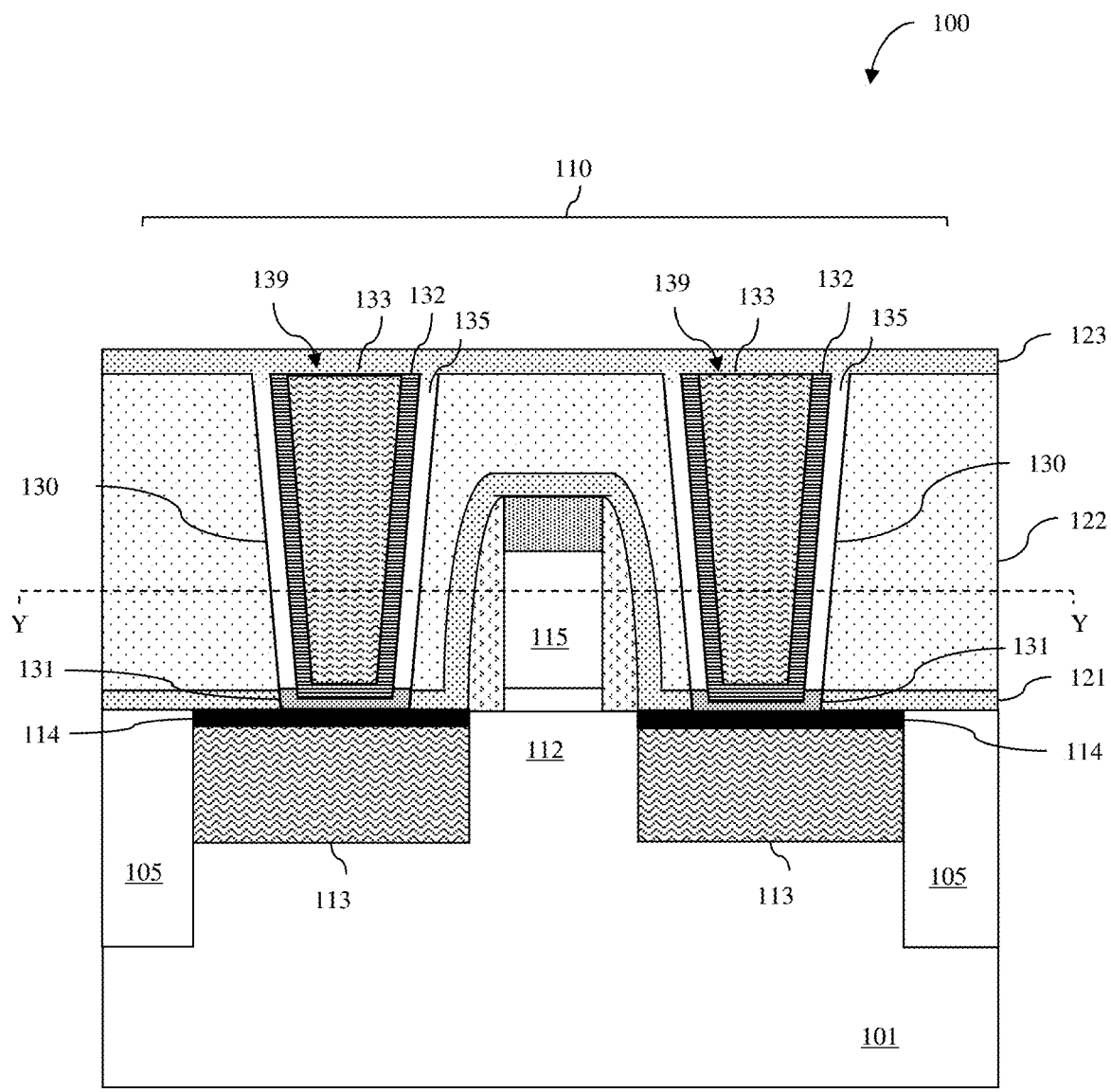
FIGS. 1A and 1B are vertical and horizontal cross-section diagrams, respectively, illustrating exemplary embodiments of an integrated circuit (IC) structure where each source/drain contact for a transistor is in a contact opening and at least partially separated from the sidewall(s) of the contact opening by an ultralow-K dielectric (ULK)-gap.

More particularly, referring to FIG. 1A, disclosed herein are embodiments of an integrated circuit (IC) structure 100. The IC structure 100 can include a substrate 101. The substrate can be, for example, a bulk semiconductor substrate (e.g., a bulk silicon substrate or any other suitable bulk semiconductor substrate), as illustrated. Alternatively, the substrate can be a semiconductor-on-insulator substrate (e.g., a silicon-on-insulator (SOI) substrate or some other suitable semiconductor-on-insulator substrate).

In any case, the IC structure 100 can also include one or more devices 110 on the substrate 101. A device 110 can be any type of device that requires at least one contact to provide at least one electrical connection to a back-end-of-the-line (BEOL) metal level interconnect and, thereby to another on-chip device or to an off-chip structure. The device 110 can be an active semiconductor device (e.g., a field effect transistor, a bipolar transistor, a heterojunction bipolar transistor, etc.). Alternatively, the device 110 can be a passive semiconductor device (e.g., a resistor, a capacitor, an inductor, a diode, etc.).

For purposes of illustration, the device 110 is shown in the figures as being a field effect transistor (FET). This FET can include isolation regions 105 (e.g., shallow trench isolation region (STI) regions) and an active semiconductor device region positioned laterally between the STI regions 105. The active device region can include source/drain regions 113 and a channel region 112 positioned laterally between the source/drain regions 113. The FET can further include a gate structure 115 adjacent to the channel region 112. The gate structure 115 can include, for example, one or more gate dielectric layers, one or more gate conductors on the gate dielectric layer, gate sidewall spacers and a gate cap. Optionally, the FET can further include metal silicide layers 114, as illustrated. The metal silicide layers 114 can be, for example, cobalt silicide (CoSi) layers, nickel silicide (NiSi) layers, tungsten silicide (WSi) layers, titanium silicide (TiSi) layers, etc.) on the source/drain regions 113. For purposes of illustration, the FET is shown in the figures as being a planar FET.

It should be understood that the figures are not intended to be limiting. Alternatively, the device 110 could be a non-planar FET (e.g., a fin-type FET (finFET), a gate-all-around FET (GAAFET), or any other suitable type of non-planar FET). And again, the device 110 could, alternatively, be any other type of active or passive semiconductor device that requires at least one contact to provide at least one electrical connection to a back-end-of-the-line (BEOL) metal level interconnect and, thereby to another on-chip device or to an off-chip structure.

Optionally, the IC structure 100 can include a relatively thin conformal etch stop layer 121 that covers the device 110, as illustrated. The conformal etch stop layer 121 can be made of a first dielectric material. In some embodiments, this first dielectric material can be a non-oxygen containing dielectric material such as silicon nitride (SiN), silicon carbon nitride (SiCN), etc.

The IC structure 100 can further include a relative thick dielectric layer 122 on the etch stop layer 121. The dielectric layer 122 can have a bottom surface, which is adjacent to the device 110 (e.g., immediately adjacent to the top surface of the conformal etch stop layer 121). The dielectric layer 122 can further have a top surface, which is essentially planar. As illustrated, in FIG. 1A, the top surface of the dielectric layer 122 can be some distance above the level of the top of the device 110 and, in this case, above the level of the top of the gate structure 115. In some embodiments, the dielectric layer 122 can be an oxygen-containing dielectric layer. For example, the dielectric layer 122 can be a blanket layer of borophosphosilicate glass (BPSG). Those skilled in the art will recognize that BPSG is a film made of a mixture of oxygen and hydrides of silicon, boron and phosphorus. Alternatively, the dielectric layer 122 could be a silicon dioxide layer or some other suitable oxygen-containing interlayer dielectric (ILD) material.

Figure 1B:
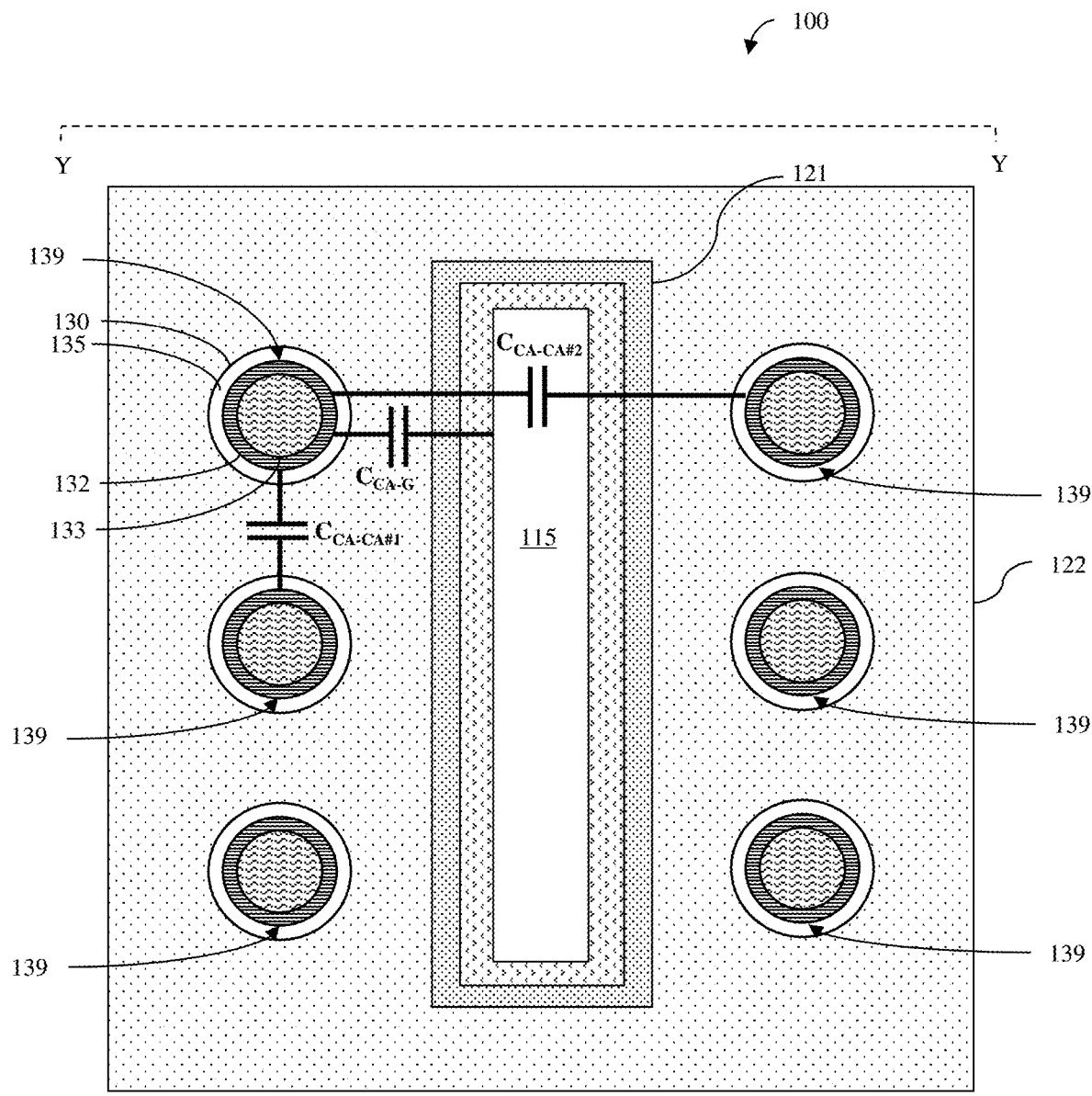
Figure 2A:
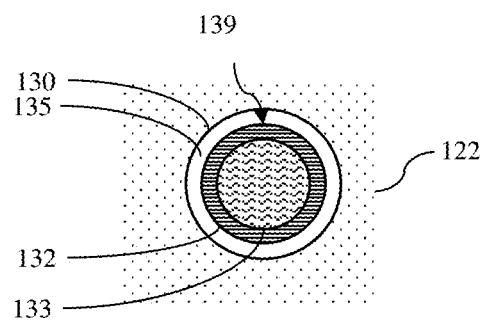
FIGS. 2A-2D are horizontal cross-section diagrams illustrating exemplary contact shapes and ULK-gaps wrapped laterally around such contacts.
Figure 2B:
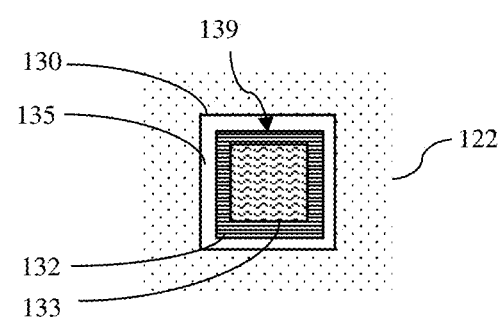
Figure 2C:
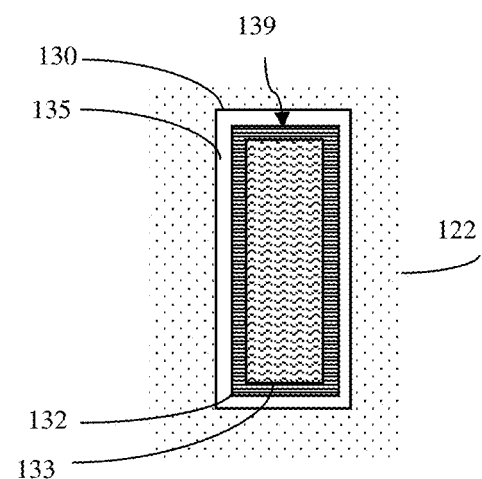
Figure 2D:
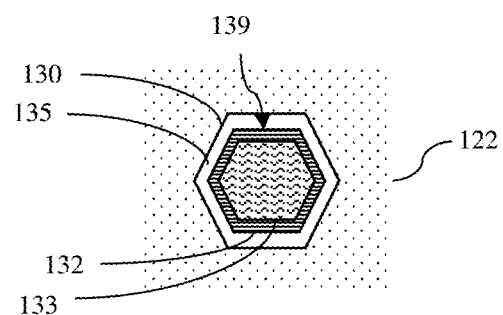

One or more contact openings 130 can extend through the dielectric layer 122 (i.e., from the top surface to the bottom surface). The contact opening(s) 130 can further extend through the conformal etch stop layer 121, if present. Thus, each contact opening 130 can have a lower section within the etch stop layer 121 and an upper section above the lower section and within the dielectric layer 122. In any case, the contact opening(s) 130 can extend to component(s), respectively, of the device 110. It should be noted that in a horizontal cross-section, each contact opening 130 could be essentially round or oval in shape (e.g., as shown in FIG. 1B and also as shown in FIG. 2A) so that each contact opening 130 has a single continuous annular sidewall. Alternatively, each contact opening 130 can, in a horizontal cross-section, have any other suitable shape. For example, in a horizontal cross-section, each contact opening 130 could be essentially square in shape (as shown in FIG. 2B), essentially rectangular in shape (e.g., as shown in FIG. 2C), essentially hexagonal in shape (e.g., as shown in FIG. 2D), etc. so as to have multiple essentially planar sidewalls joined at corners.

Figure 3:
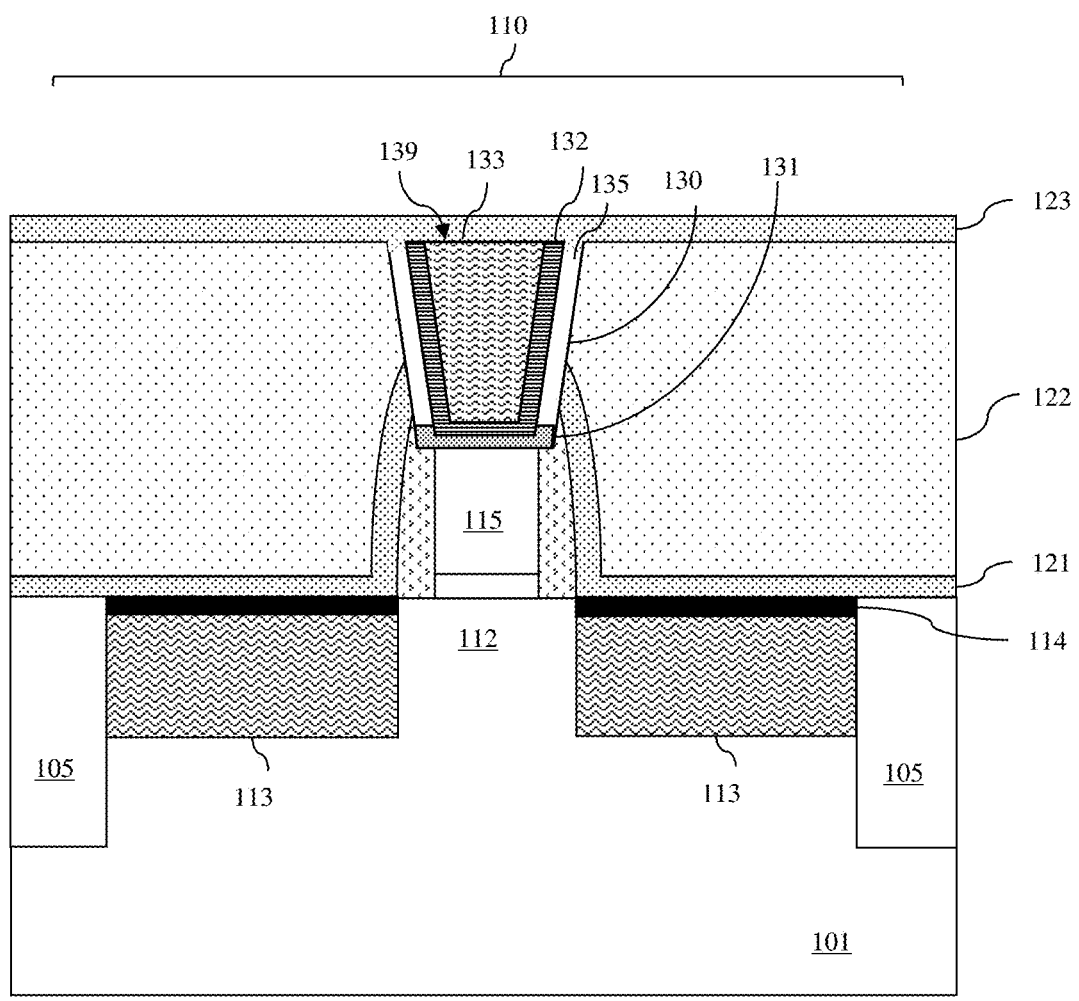
FIG. 3 is a cross-section diagram illustrating another exemplary embodiment of an integrated circuit (IC) structure where the gate contact of a transistor is in a contact opening and at least partially separated from the sidewall(s) of the contact opening by a ULK-gap.
Figure 4:
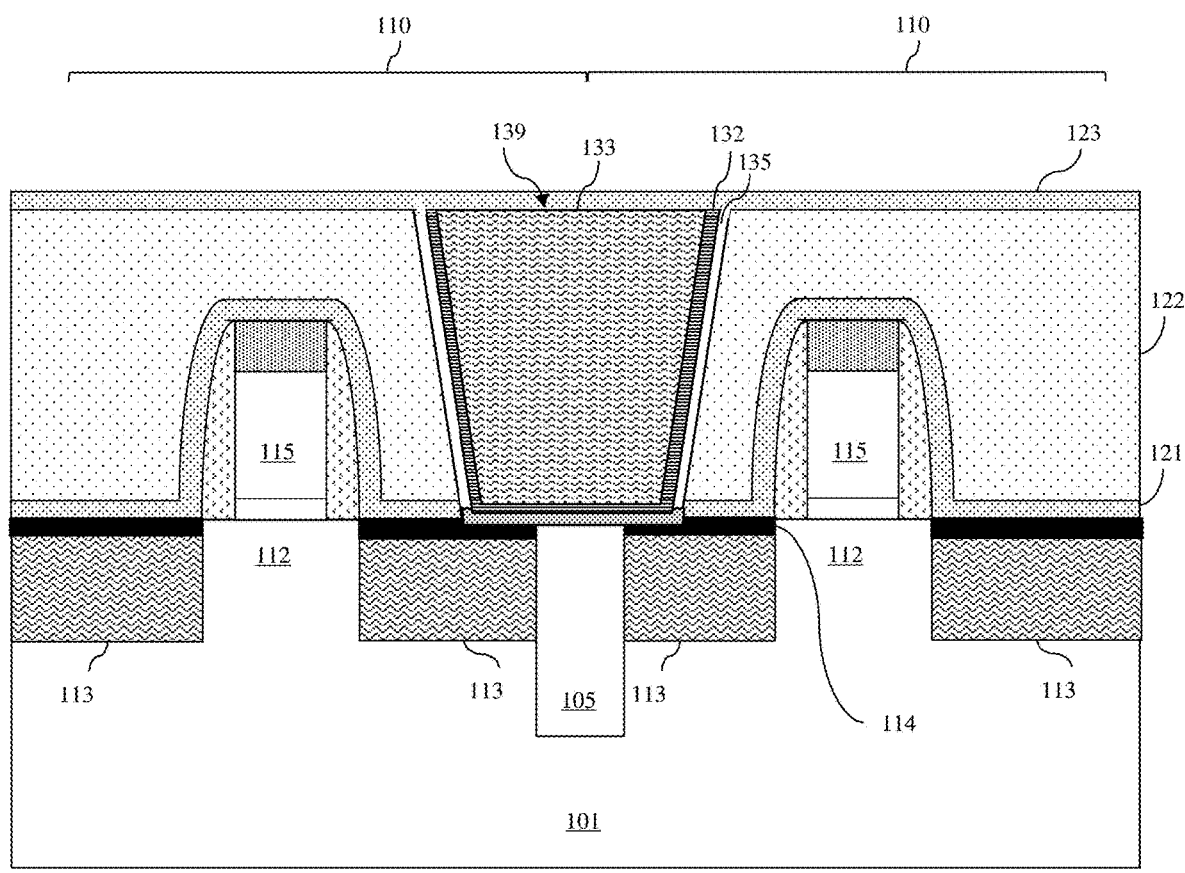
FIG. 4 is a cross-section diagram illustrating yet another exemplary embodiment of an integrated circuit (IC) structure where a single source/drain contact to adjacent source/drain regions of adjacent transistors is in a contact opening and at least partially separated from the sidewall(s) of the contact opening by a ULK-gap.

In the exemplary FET shown in FIG. 1A, the contact openings 130 extend completely through the dielectric layer 122 and the conformal etch stop layer 121 to the metal silicide layers 114 on the source/drain regions 113. FIG. 1B is a cross-section YY diagram further illustrating that in some exemplary embodiments multiple contact openings 130 can extend through the dielectric layer 122 to each of the source/drain regions 113 (i.e., on both sides of the gate structure 115). Again, it should be understood that the figures are not intended to be limiting. Additionally, or alternatively, a contact opening 130 could be aligned above and extend down to the gate structure 115, as shown in FIG. 3. Additionally, or alternatively, a contact opening 130 could be aligned above and extend down to both of two adjacent source/drain regions 113 of two adjacent FETs, as shown in FIG. 4. Furthermore, if the device 110 is a different type of active semiconductor device or a passive semiconductor device, a contact opening 130 could be aligned above and extend down to some other specific feature of that device.

The IC structure 100 can further include a contact 139 within each contact opening 130. The contact 139 can be electrically connected to at least one feature of at least one device 110 aligned below the contact opening 130. For example, in the case of a FET, contacts 139 can be in contact openings 130 that are aligned above the source/drain regions 113 and these contacts can be electrically connected to the source/drain regions 113 (e.g., via the metal silicide layer 114, if present), as illustrated in FIG. 1A. Additionally, or alternatively, a contact 139 can be in a contact opening 130 aligned above the gate structure 115 and can be electrically connected to the gate structure 115, as illustrated in FIG. 3. Additionally, or alternatively, a contact opening 130 could be aligned above adjacent source/drain regions of adjacent FETs and a contact 139 in the contact opening 130 could be electrically connected to the adjacent source/drain regions of both FETs (e.g., via metal silicide layers, if present), as illustrated in FIG. 4. Furthermore, if the device 110 is a different type of active semiconductor device or a passive semiconductor device, then a contact 139 can be in a contact opening 130, which is aligned above some feature of the device, and can be electrically connected to that feature. Such a contact 139 can be electrically connected to a back-end-of-the-line (BEOL) metal level interconnected so as to further electrically connect the device 110 to any of another on-chip device or to an off chip device.

In any case, each contact 139 can be at least partially physically separated from the sidewall(s) of its respective contact opening 130 by a relatively thin ultralow-K (ULK) dielectric-gap 135. For purposes of this disclosure, a "gap" refers to a space or area, which separates the identified components (i.e., the sidewall(s) of a contact opening 130 and the contact 139 contained within the contact opening 130) and which is not filled by solid or liquid material. A ULK dielectric-gap is a gap that is characterized by an ultralow-K dielectric constant (e.g., K<1.1). For example, the ULK dielectric-gap can be an air-filled gap (also referred to herein as an air-gap). Those skilled in the art will recognize that "air" has a dielectric constant of approximately 1 and typically refers to a mixture of gases that include nitrogen, oxygen, argon, carbon dioxide, water vapor, etc. and, possibly, also dust or other particles. Alternatively, the ULK dielectric-gap can be a gas-filled gap, which is filled with different gaseous material(s) than air and which still has a dielectric constant of less than 1.1. Such a gas-filled gap can, for example, be filled with a single relatively pure gas or, alternatively, some mixture of one or more gases with or without dust or other particles. Alternatively, the ULK dielectric-gap can be a void or, more particularly, a gap that is not filled with material but instead devoid of matter (i.e., a space under vacuum). In any case, the ULK dielectric-gap 135 can wrap laterally around the contact 139 within the contact opening 130 so that it is between the contact 139 and the sidewall(s) of the contact opening 130. Thus, such contacts 139 are also referred to herein as ULK dielectric-gap wrapped contacts or ULK dielectric-gap cladded contacts.

More specifically, each contact 139 can include a metal fill material structure 133. This metal fill material structure 133 can have a top surface that is essentially coplanar with the top surface of the dielectric layer 122. The metal fill material structure 133 can be, for example, a metal plug. The metal fill material structure 133 can be made, for example, of tungsten. Alternatively, the metal fill material structure 133 could be made of any other suitable metal or metal alloy fill material employed for contacts (e.g., cobalt, etc.). The metal fill material structure 133 can also include bottom and side surfaces that are essentially parallel to and physically separated from the bottom and side surfaces (including the sidewall(s)) of the contact opening 130.

Optionally, each contact 139 can include one or more conformal layers wrapped around the bottom and side surfaces of the metal fill material structure 133 and also physically separated from the bottom and side surfaces (including the sidewall(s)) of the contact opening 130. For example, each contact 139 can include a conformal conductive barrier layer 132 wrapped around and immediately adjacent to the bottom and side surfaces of the metal fill material structure 133 and also physically separated from the bottom and side surfaces (including the sidewall(s)) of the contact opening 130.

Each contact 139 can further include an adhesive layer 131. Specifically, the adhesive layer 131 can be at the bottom of the contact opening 130 between a specific feature of the device 110 (e.g., a source/drain region 113, as illustrated in FIG. 1A; a gate structure 115, as illustrated in FIG. 3, etc.) and the metal fill material structure 133. Additionally, the adhesive layer 131 can extend laterally beyond the metal fill material structure 133 such that an outer edge of the adhesive layer 131 is aligned below the ULK dielectric-gap 135. As illustrated, this outer edge can extend upward along the sidewall(s) of the lower section of the contact opening 130 within the etch stop layer 121. The adhesive layer 131 can be a conductive metal or metal alloy layer. For example, the adhesive layer can be a titanium (Ti) layer, a tantalum (Ta) layer or a layer of any other suitable conductive metal or metal alloy layer that can enhance adhesive between the contact 139 and the device being contacted (e.g., between the contact 139 and the metal silicide layer 114 on the source/drain region 113 in the exemplary IC structure 100 shown in FIG. 1A).

As discussed in greater detail below with regard to the method embodiments, ULK dielectric-gap formation requires the removal (e.g., etching back, recessing, etc.) of exposed top ends of the adhesive layer 131 within the space between the contact 139 and the sidewall(s) of the upper section of the contact opening 130. Therefore, if the optional conductive barrier layer 132 is incorporated into the contact 139 structure, it will ideally be made of some material that is sufficiently different from the material of the adhesive layer 131 so that, during processing, an exposed top end of the adhesive layer (e.g., which may be oxidized) can be removed (e.g., by a selective etch process) without also removing the conductive barrier layer. For example, if the adhesive material comprises titanium, then ideally the conductive barrier layer will be titanium-free. For example, the conductive barrier layer could be a tungsten nitride (WN) layer or a tantalum nitride (TaN) layer. Similarly, if the adhesive material comprises tantalum, then ideally the conductive barrier layer will be tantalum-free. For example, the conductive barrier layer could be a tungsten nitride (WN) layer or a titanium nitride (TaN) layer.

It should be noted that the figures show the ULK dielectric-gap 135 (i.e., an air-gap, gas-filled gap or void) extending approximately the full height (i.e., the full thickness) of the dielectric layer 122 and only within the upper section of the contact opening 130 within the dielectric layer 122. However, it should be understood that, depending on the specifications used for removing (i.e., etching back, recessing, etc.) the exposed top end of the adhesive layer to form a gap, the top end of the adhesive layer 131 may be etched below the level of the top surface of the etch stop layer 121 so that the height of the ULK dielectric-gap 135 may be greater than the full height of the dielectric layer 122. Alternatively, if not all of the adhesive material is removed from the space between the contact and the sidewall(s) of the upper section of the contact opening within the dielectric layer 122 when forming the gap, then the height of the ULK dielectric-gap 135 will be less than the full height of the dielectric layer 122. Additionally, as discussed in greater detail below with regard to the method embodiments, because the etch process used to form a gap within each contact opening 130 is selective and only etches the thin adhesive layer (e.g., a 5-20 nm adhesive layer), which laterally surrounds side surfaces of the metal fill material structure 133 (and, if present, the conductive barrier layer 132 thereon), the resulting ULK dielectric-gap 135 will also be relatively thin (e.g., 5-20 nm) and will similarly laterally surround the contact 139 (i.e., will wrap laterally around the contact 139). Thus, as mentioned above, the contacts 139 are ULK dielectric-gap wrapped contacts 139 (also referred to herein as ULK dielectric-gap cladded contacts).

The IC structure 100 can further include a relatively thin additional dielectric layer 123 on the top surface of the dielectric layer 122. This additional dielectric layer 123 can be another etch stop layer (e.g., a SiN layer, a SiCN layer, etc.). This additional dielectric layer 123 can cap the gap 135 within each contact opening 130. That is, because each gap 135 within each contact opening 130 is relatively narrow (e.g., 5-20 nm), this additional dielectric layer 123 will pinch off in the top of each gap during deposition and, thus, will cap (i.e., close off, encapsulate, etc.) each gap 135. As mentioned above and discussed in greater detail below with regard to the method embodiments, once capped, each gap 135 is characterized by an ultralow-K dielectric constant (e.g., K<1.1). That is, it is either an air-filled gap (i.e., an air-gap), a gas-filled gap, or a void (i.e., a space under vacuum) such that it has a dielectric constant (K) of less than 1.1. Thus, the gaps 125 within the IC structure 100 are referred to herein as ULK dielectric-gaps and the contacts 139 in the IC structure 100 are referred to herein as ULK dielectric-gap wrapped contacts or ULK dielectric-gap cladded contacts.

These ULK dielectric-gap wrapped contacts 139 can provide a significant reduction in parasitic capacitance including, but not limited to, the parasitic capacitance between two adjacent contacts on the same source/drain region (i.e., see $C_{CA\text{-}CA\ \#1}$ shown in FIG. 1B), the parasitic capacitance between two adjacent contacts on opposite source/drain regions (i.e., see $C_{CA\text{-}CA\ \#2}$ shown in FIG. 1B), and the parasitic capacitance between a contact on a source/drain region and the gate structure (e.g., see $C_{A\text{-}G}$ shown in FIG. 1B). Those skilled in the art will recognize that the amount of reduction in parasitic capacitance will vary depending upon the dielectric material used for the dielectric layer 122 and within the gap (if any) as well as the size of the contacts, the width of the ULK dielectric-gap 135 that wraps around each contact, and the distance between the contact and the adjacent structure (e.g., another contact, a gate structure, etc.) with which it is capacitively coupled.

For example, consider an IC structure 100 where the dielectric layer 122 is made of BPSG with a dielectric constant (K) of 4.1 and where two contacts that land on the device 110 are physically separated by a total distance of 500 nm, which includes: 475 nm of BPSG; 12.5 nm of oxidized metal adhesive material (e.g., titanium oxide) or air adjacent to one of the contacts; and another 12.5 nm of the oxidized metal adhesive material or air adjacent to the other one of the contacts. When the two contacts are physically separated by 475 nm of BPSG plus 25 nm of air, which has a dielectric constant (K) of approximately 1, as opposed to 475 nm of BPSG plus 25 nm of oxidized metal adhesive material (e.g., titanium oxide), which has a dielectric constant (K) of 10 or more, the contact-to-contact capacitance ($C_{CA-CA}$) can be reduced by 15 percent or more.

Figure 5:
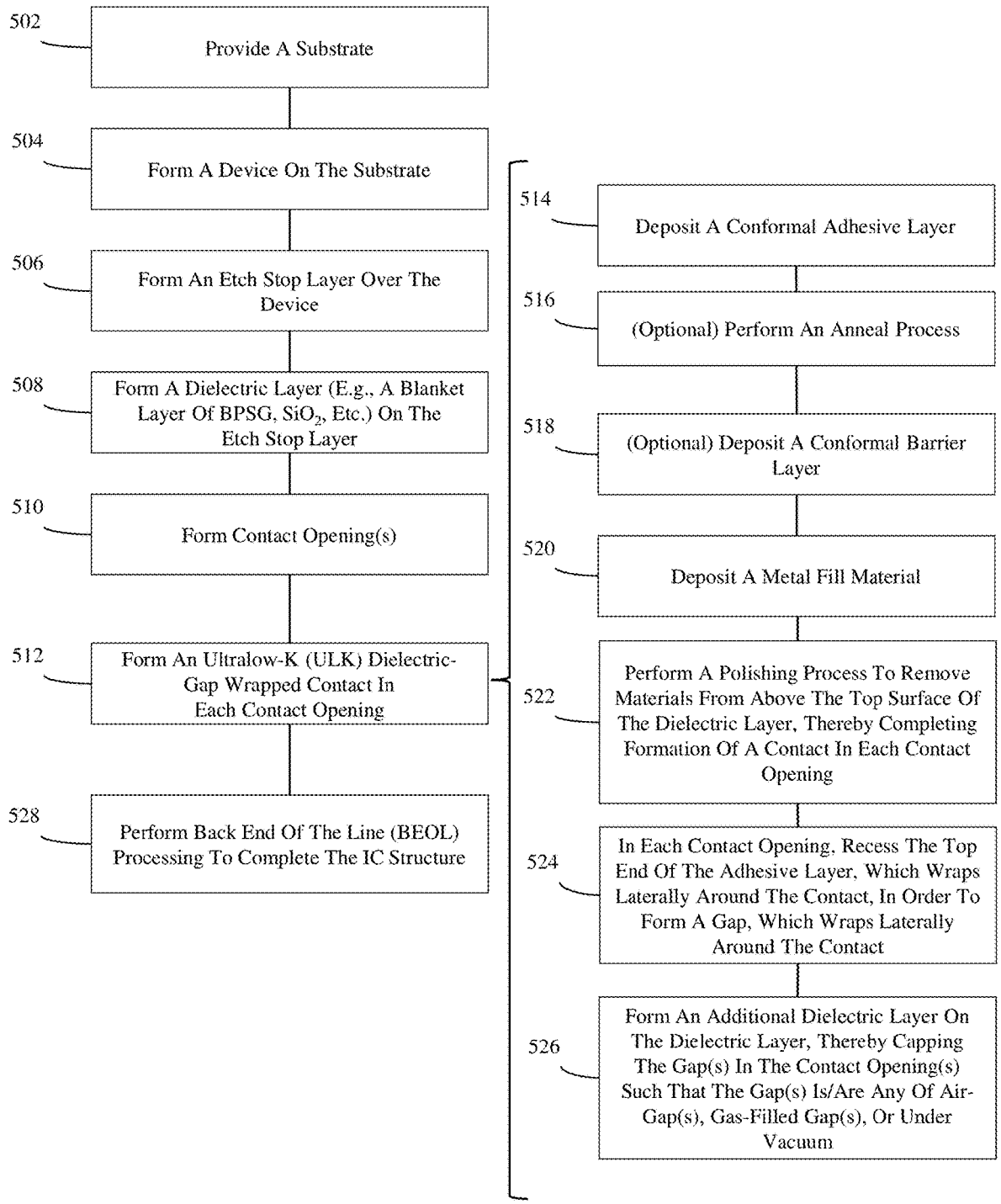
FIG. 5 is a flow diagram illustrating method embodiments disclosed herein.

Referring to the flow diagram of FIG. 5, disclosed herein are embodiments of a method of forming the above-described integrated circuit (IC) structure 100.

Figure 6:
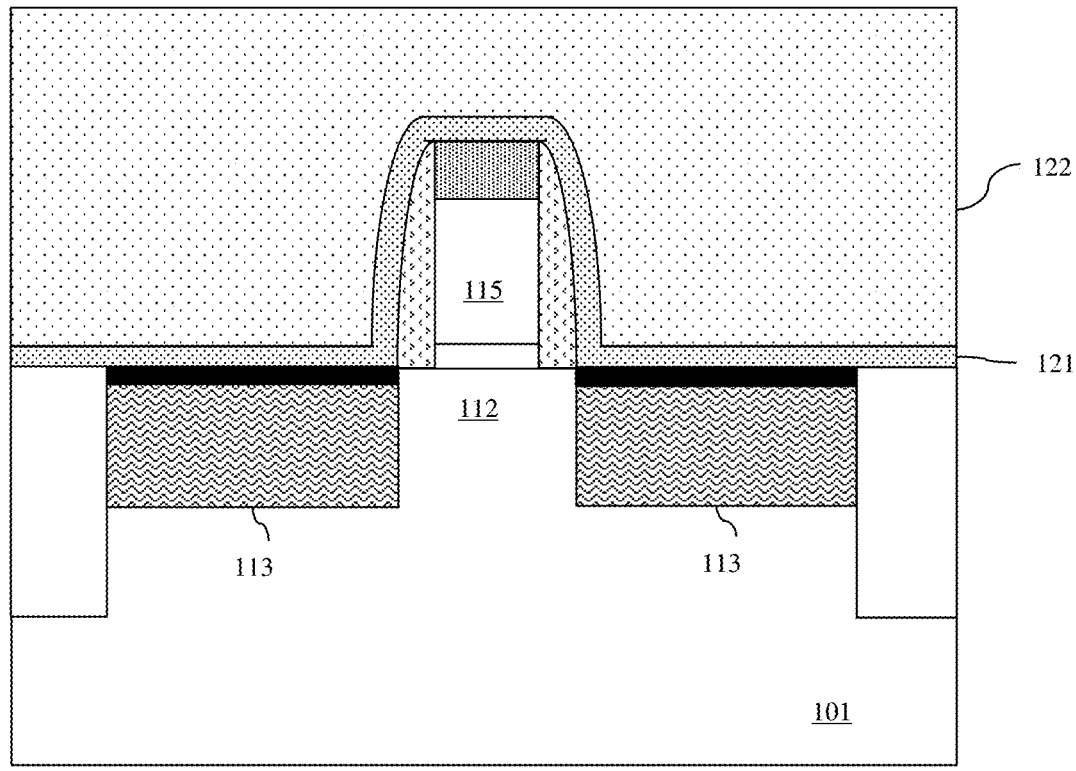
FIG. 6 is a cross-section diagram illustrating an exemplary partially completed IC structure formed according to the flow diagram of FIG. 5.

The method can include providing a substrate 101 (see process step 502 and FIG. 6). The substrate can be, for example, a bulk semiconductor substrate (e.g., a bulk silicon substrate or any other suitable bulk semiconductor substrate), as illustrated. Alternatively, the substrate can be a semiconductor-on-insulator substrate (e.g., a silicon-on-insulator (SOI) substrate or some other suitable semiconductor-on-insulator substrate).

The method can further include forming one or more devices 110 on the substrate 101 (see process step 504 and FIG. 6). A device 110 formed at process step 504 can be any type of device 110 that requires at least one contact to provide at least one electrical connection to a back-end-of-the-line (BEOL) metal level interconnect and, thereby to another on-chip device or to an off-chip structure. For example, a device 110 formed at process step 504 can be an active semiconductor device (e.g., a field effect transistor, a bipolar transistor, a heterojunction bipolar transistor, etc.) or, alternatively, a passive semiconductor device (e.g., a resistor, a capacitor, an inductor, a diode, etc.). Various different techniques for forming such devices are well known in the art and, thus, the details of the techniques have been omitted from the specification in order to allow the readers to focus on the salient aspects of the disclosed embodiments.

In some embodiments, the device 110 formed at process step 504 can be a field effect transistor (FET). The FET can be formed so as to have an active semiconductor device region positioned laterally between shallow trench isolation (STI) regions 105. The FET can be formed so as to include source/drain regions 113 within the active semiconductor device region and a channel region 112 positioned laterally between the source/drain regions 113. The FET can further be formed so as to include a gate structure 115 adjacent to the channel region 112. Optionally, the FET can be formed so as to include metal silicide layers 114 (e.g., cobalt silicide (CoSi) layers, nickel silicide (NiSi) layers, tungsten silicide (WSi) layers, titanium silicide (TiSi) layers, etc.) on the source/drain regions 113. For purposes of illustration, the FET shown in the figures is a planar FET. However, it should be understood that the figures are not intended to be limiting. Thus, alternatively, the device 110 formed at process step 504 could be a non-planar FET (e.g., a fin-type FET (finFET), a gate-all-around FET (GAAFET), or any other suitable type of non-planar FET). And again, the device 110 formed at process step 504 could, alternatively, be any other type of active or passive semiconductor device that requires at least one contact to provide at least one electrical connection to a back-end-of-the-line (BEOL) metal level interconnect and, thereby to another on-chip device or to an off-chip structure.

Optionally, the method can further include forming a relatively thin conformal etch stop layer 121 over the device(s) 110 (see process step 506 and FIG. 6). The conformal etch stop layer 121 can be made of a first dielectric material. In some embodiments, this first dielectric material can be a non-oxygen containing dielectric material such as silicon nitride (SiN), silicon carbon nitride (SiCN), etc. Such a thin conformal etch stop layer 121 can be deposited, for example, by chemical vapor deposition (CVD), atomic layer deposition (ALD) or by any other suitable thin film conformal deposition technique.

The method can further include forming a dielectric layer 122 on the conformal etch stop layer 121 (see process step 508 and FIG. 6). The dielectric layer 122 can be formed as a blanket layer over the partially completed structure such that it has a bottom surface, which is adjacent to the device 110 (e.g., immediately adjacent to the top surface of the conformal etch stop layer 121) and a top surface opposite the bottom surface. A chemical mechanical polishing (CMP) process can be formed following deposition of the dielectric layer 122 so as to ensure that the top surface of the dielectric layer 122 is essentially planar. As illustrated, in FIG. 1A, the CMP process can be performed so as to leave the top surface of the dielectric layer 122 some distance above the level of the top of the device 110 and, in the FET example, above the level of the top of the gate structure 115. In some embodiments, the dielectric layer 122 can be an oxygen-containing dielectric layer. For example, the dielectric layer 122 can be a blanket layer of borophosphosilicate glass (BPSG). Those skilled in the art will recognize that BPSG is a film made of a mixture of oxygen and hydrides of silicon, boron and phosphorus. Alternatively, the dielectric layer 122 could be a silicon dioxide layer or other suitable oxygen-containing interlayer dielectric (ILD) layer. In any case, such a dielectric layer 122 can, for example, be deposited by CVD or any other suitable deposition technique.

Figure 7:
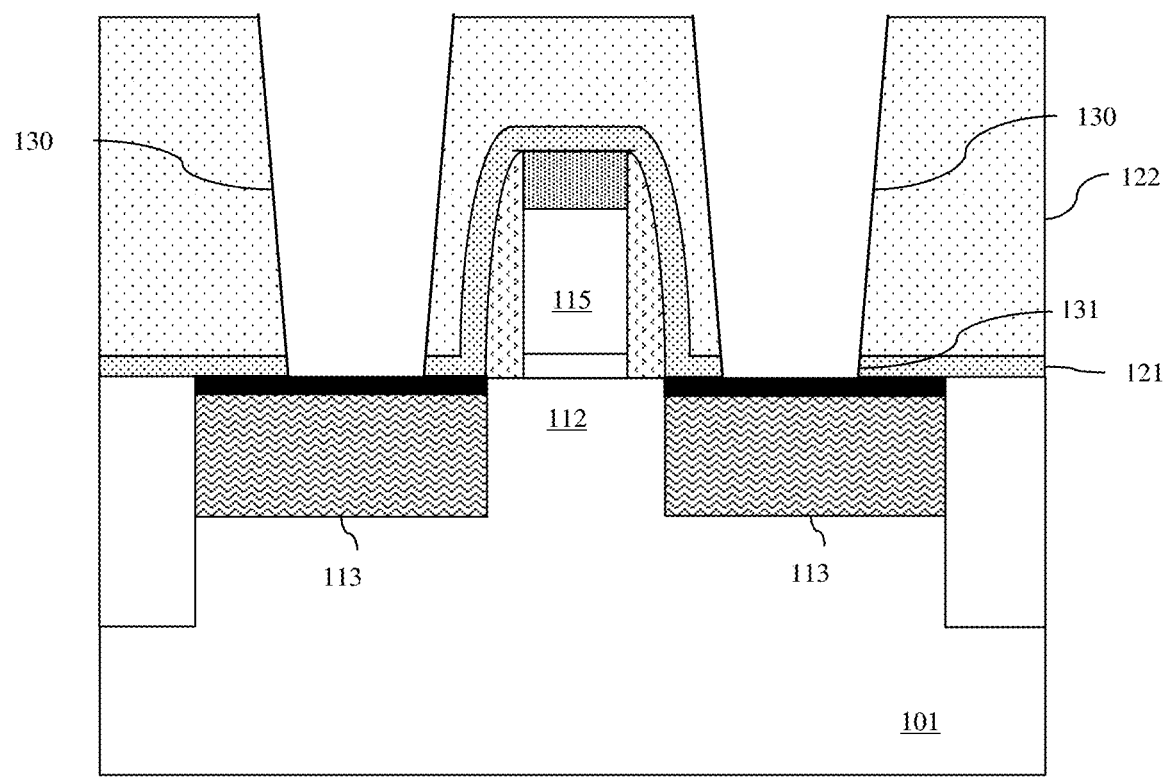
FIG. 7 is a cross-section diagram illustrating an exemplary partially completed IC structure formed according to the flow diagram of FIG. 5.

One or more contact openings 130 can then be formed so that each contact opening 130 extends essentially vertically through the dielectric layer 122 (i.e., from the top surface to the bottom surface) (see process step 510 and FIG. 7). The contact opening(s) 130 can further be formed so as to extend through the conformal etch stop layer 121, if present. Thus, each contact opening 130 can have a lower section within the etch stop layer 121 and an upper section above the lower section and within the dielectric layer 122.

Figure 8A:
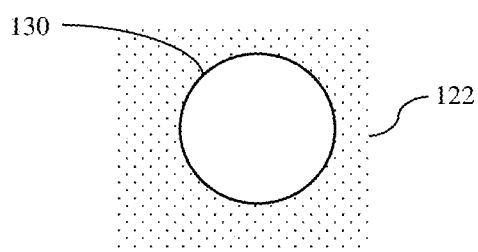
FIGS. 8A-8D are horizontal cross-section diagrams illustrating exemplary contact opening shapes.
Figure 8B:
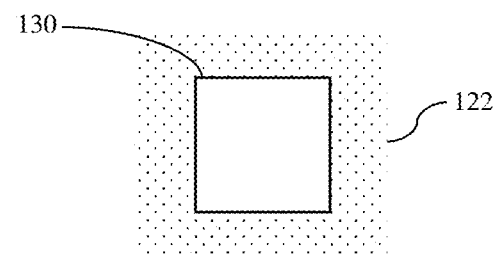
Figure 8C:
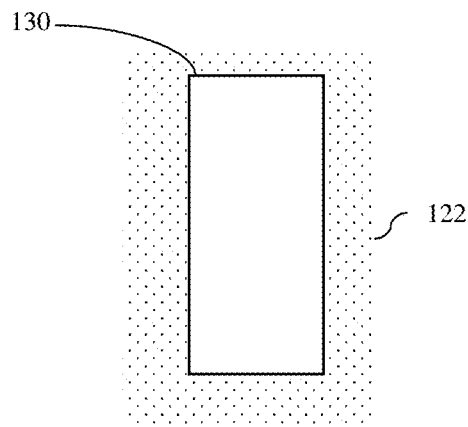
Figure 8D:
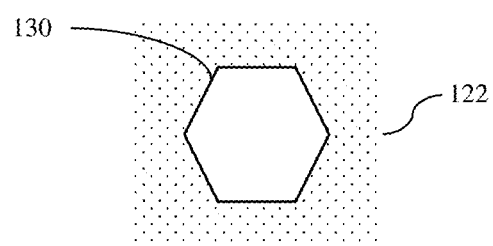

Those skilled in the art will recognize that, although the contact opening(s) 130 will extend essentially vertically through the dielectric layer 122, depending upon the etch specifications used the sidewall(s) of each contact opening may be vertical so that the width of each contact opening is essentially uniform from the top of the contact opening to the bottom. However, alternatively, the sidewall(s) of each contact opening may be angled such that the width of each contact opening is non-uniform (e.g., tapered so that each contact opening is wider at the top than at the bottom, as illustrated). Additionally, it should be noted that each contact opening 130 could be formed (e.g., lithographically patterned and etched) so that, in a horizontal cross-section, it is essentially round or oval in shape (as shown in FIG. 8A) and, thus, so that it has a single continuous annular sidewall. Alternatively, each contact opening 130 could be formed (e.g., lithographically patterned and etched) so that, in a horizontal cross-section, it has any other suitable shape including, but not limited to, an essentially square shape (as shown in FIG. 8B), an essentially rectangular shape (e.g., as shown in FIG. 8C), and an essentially hexagonal in shape (e.g., as shown in FIG. 8D) and, thus, so that it has multiple essentially planar sidewalls joined at corners. In any case, the contact opening(s) 130 can extend to component(s), respectively, of the device 110.

For example, for the FET shown in FIG. 7, the contact openings 130 have been formed (e.g., lithographically patterned and etched) at process step 510 so that they are aligned above the source/drain regions 113 and so that they extend through the dielectric layer 122 and further through the conformal etch stop layer 121 to the metal silicide layers 114 on the source/drain regions 113. Again, it should be understood that the figures are not intended to be limiting. Additionally, or alternatively, a contact opening 130 could be formed (e.g., lithographically patterned and etched) so that it is aligned above and lands on the gate structure 115 (as shown in the IC structure of FIG. 3). Additionally, or alternatively, a contact opening 130 could be formed (e.g., lithographically patterned and etched) so that it is aligned above and lands on both of two adjacent source/drain regions 113 of two adjacent FETs (as shown in the IC structure of FIG. 4). Furthermore, if the device 110 is a different type of active semiconductor device or a passive semiconductor device, then a contact opening 130 could be formed (e.g., lithographically patterned and etched) so that it is aligned above and lands on some other specific feature of that device.

In any case, techniques for forming contact openings (including conventional lithographic patterning and etch processes) are well known in the art. Therefore, the details have been omitted from this specification in order to allow the reader to focus on the salient aspects of the disclosed embodiments.

The method can further include forming an ultralow-K (ULK) dielectric-gap wrapped contact 139 (also referred to herein as a ULK dielectric-gap cladded contact) within each contact opening 130 (see process step 512).

Figure 9:
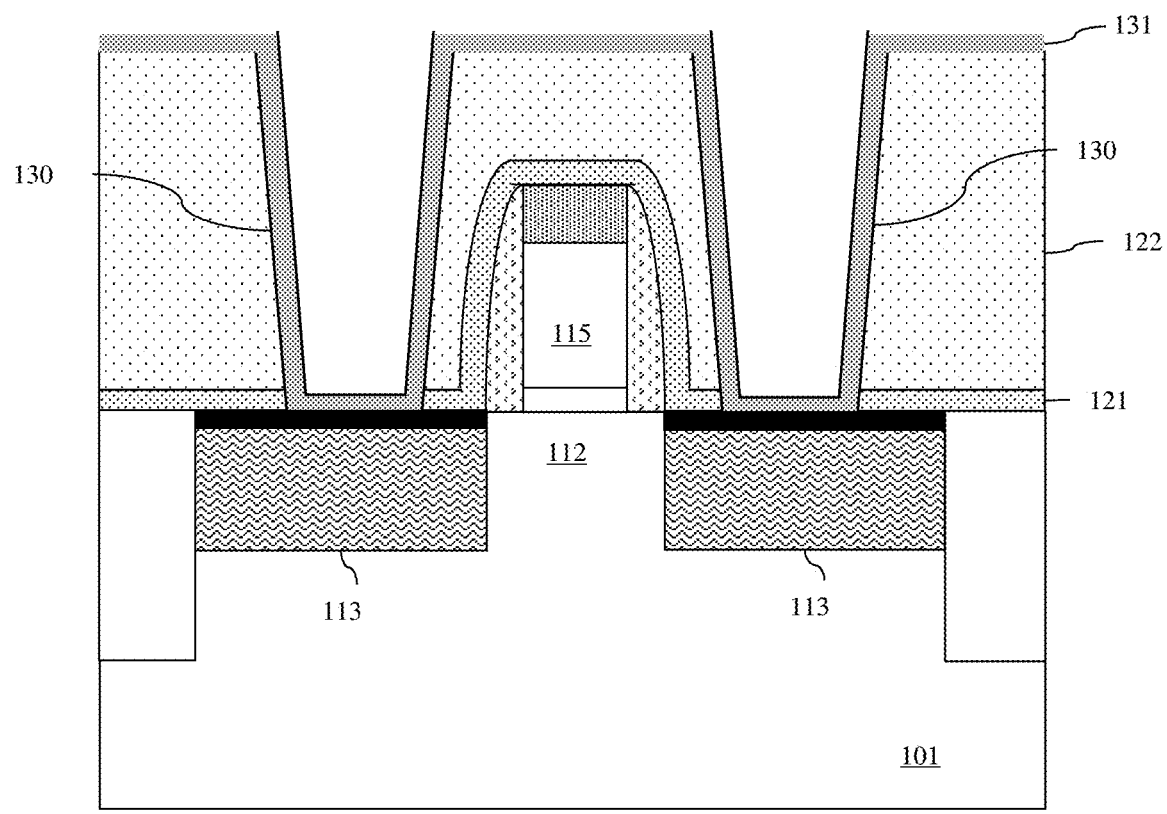
FIG. 9 is a cross-section diagram illustrating an exemplary partially completed IC structure formed according to the flow diagram of FIG. 5.

Specifically, an adhesive layer 131 can be conformally deposited over the partially completed structure so as to line each contact opening 130 (see process step 514 and FIG. 9). The adhesive layer 131 can be a metal or metal alloy layer. For example, the adhesive layer 131 can be a titanium (Ti) layer, a tantalum (Ta) layer or a layer of any other suitable conductive metal or metal alloy material that can enhance adhesive between the contact 139 and the device being contacted (e.g., between the contact 139 and the metal silicide layer 114 on the source/drain region 113). The adhesive layer 131 can be deposited so that it is relatively thin (e.g., a 5-20 nm layer). The adhesive layer 131 can, for example, be deposited by using a sputter deposition technique or by any other suitable thin metal film deposition technique.

Figure 10:
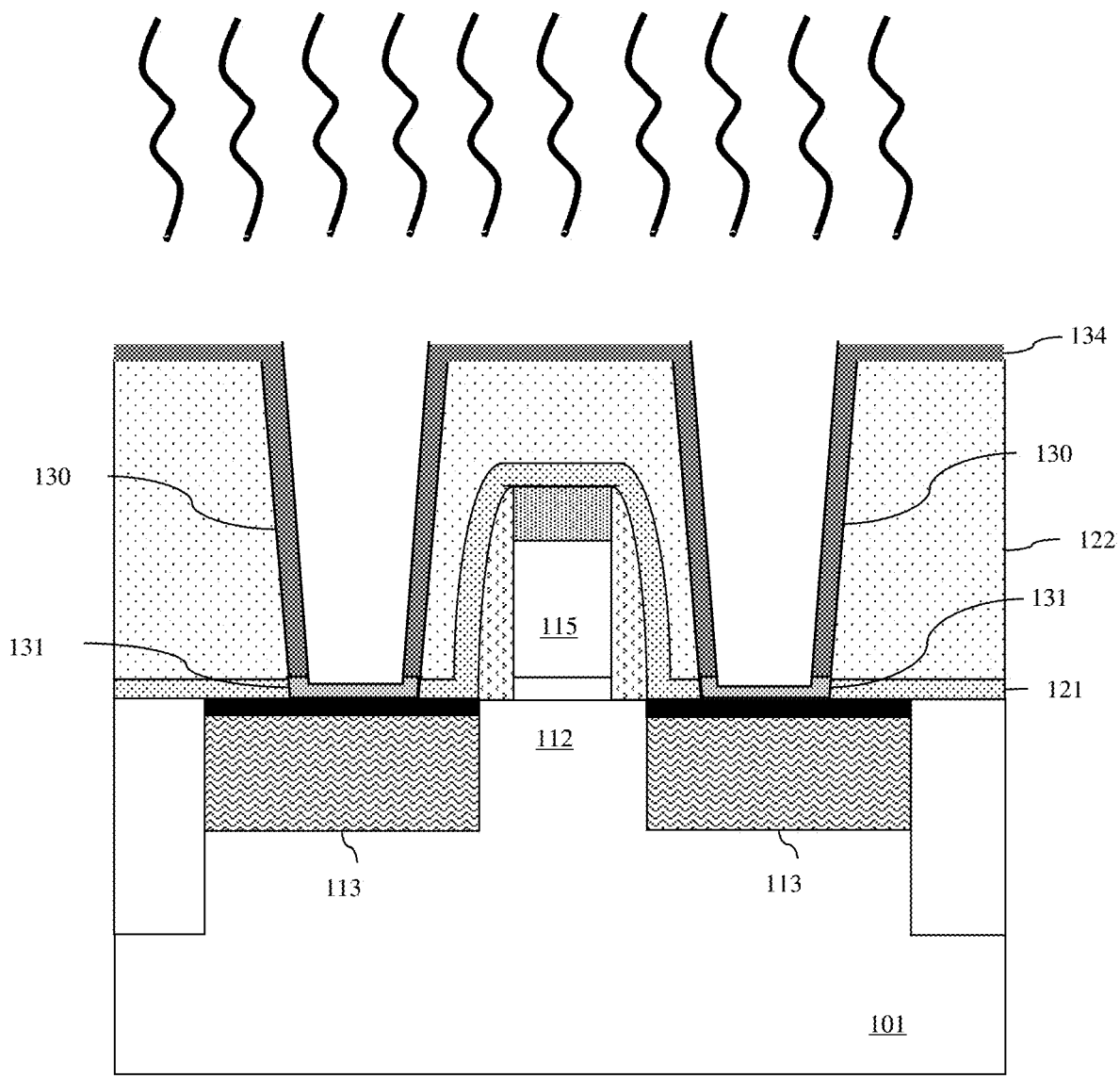
FIG. 10 is a cross-section diagram illustrating an exemplary partially completed IC structure formed according to the flow diagram of FIG. 5.

Following deposition of the adhesive layer 131, a heat treating process can be performed (see process step 516 and FIG. 10). For example, an anneal process, such as a forming gas (FG) anneal process, can be performed during which the work piece (i.e., the partially completed IC structure) is heated to a temperature of 500-700° C. (e.g., to a temperature of 600° C.). Such a heat treating process can be employed to, for example, reduce residual stress during fabrication. Additionally, this heat treating process may result in oxidation of the any portion of the adhesive layer 131 that is immediately adjacent to an oxygen-containing dielectric material (e.g., BPSG or $SiO_2$ in the dielectric layer 122). In this case, the heat treating process can result in an oxidized portion 134 of the adhesive layer 131 (e.g., a titanium oxide portion) being present within the upper section of each contact opening 130 (i.e., within the dielectric layer 122) and a remaining pure portion (e.g., titanium) of the adhesive layer 131 will be in the lower section of the contact opening 130 within the etch stop layer 121 (e.g., at the bottom of each contact opening 130).

Figure 11:
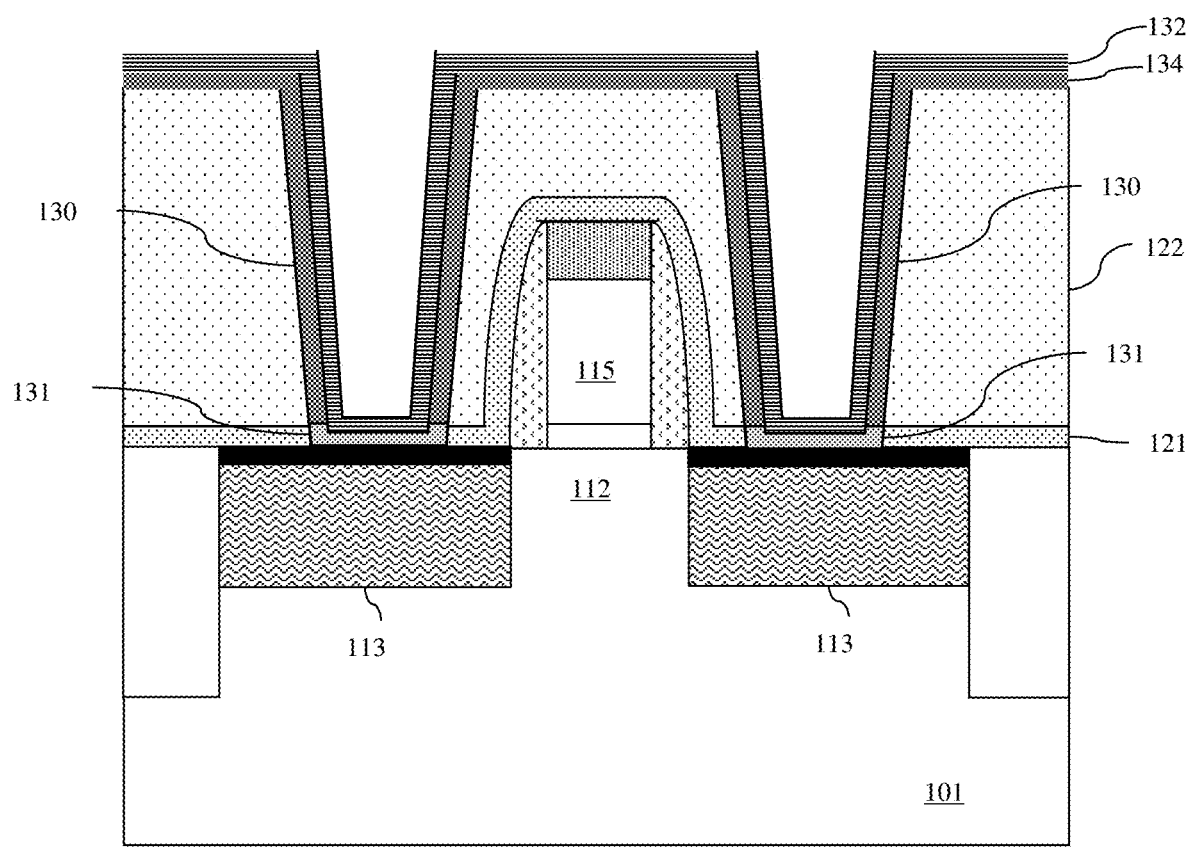
FIG. 11 is a cross-section diagram illustrating an exemplary partially completed IC structure formed according to the flow diagram of FIG. 5.
Figure 12:
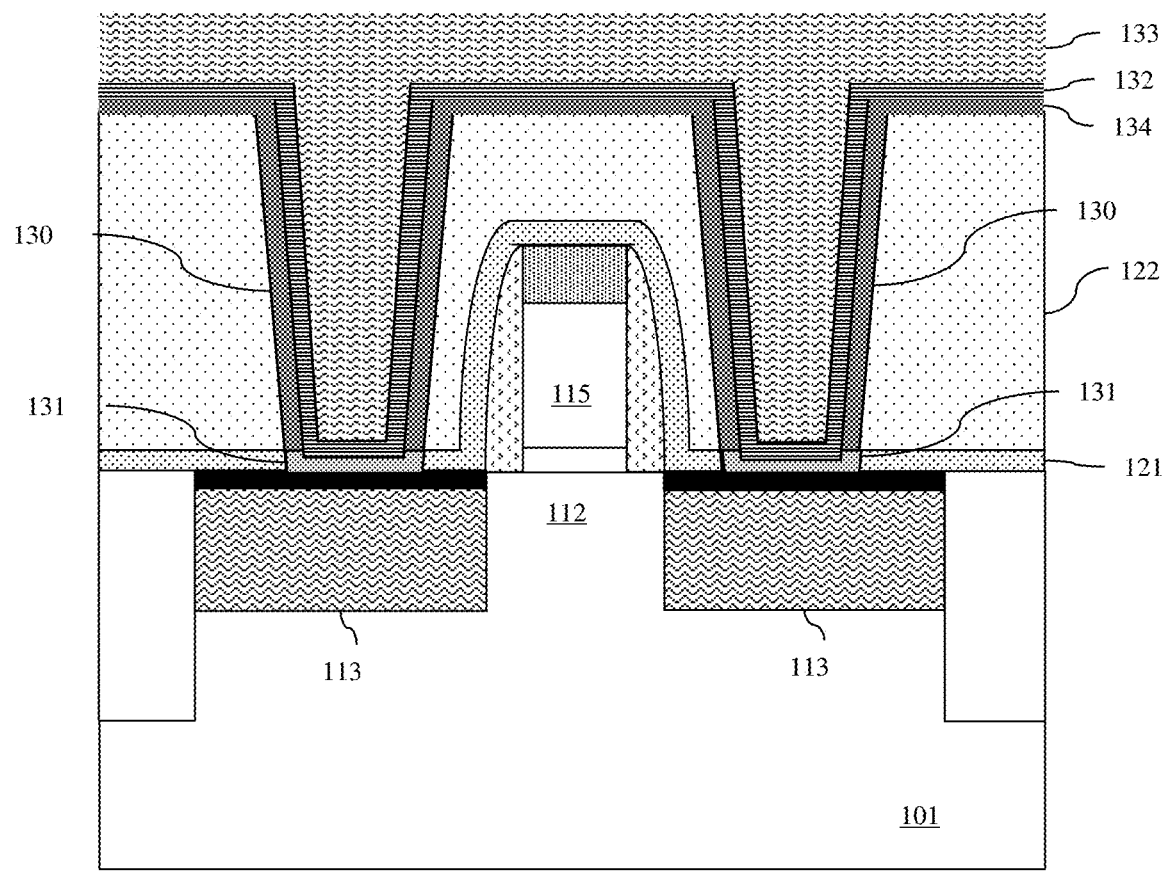
FIG. 12 is a cross-section diagram illustrating an exemplary partially completed IC structure formed according to the flow diagram of FIG. 5.

Optionally, a conductive barrier layer 132 can be conformally deposited over the partially completed structure (see process step 518 and FIG. 11). As discussed in greater detail below at process step 524, if an optional conductive barrier layer 132 is deposited at process step 516, it will ideally be made of a material that is sufficiently different from the material of the adhesive layer 131 in order to facilitate selective etching back of (i.e., selective removal, selective recessing, etc. of) the exposed top end of the adhesive layer 131 adjacent to the sidewall(s) of each upper section of each contact opening at process step 524 discussed below. For example, if the adhesive material is titanium, then ideally the conductive barrier layer will be titanium-free (e.g., the conductive barrier layer could be a tungsten nitride (WN) layer or a tantalum nitride (TaN) layer). Similarly, if the adhesive material is tantalum, then ideally the conductive barrier layer will be tantalum-free (e.g., the conductive barrier layer could be a tungsten nitride (WN) layer or a titanium nitride (TaN) layer). In any case, the conductive barrier layer 132 can be deposited so that it is relatively thin (e.g., a 5-20 nm layer). The conductive barrier layer 132 can, for example, be deposited using an atomic layer deposition (ALD) technique or by any other suitable conformal thin film deposition technique.

A metal fill material 133 can then be deposited so as to fill each contact opening 130 (see process step 520 and FIG. 11). The metal fill material 133 can be, for example, tungsten, cobalt or any metal or metal alloy fill material suitable for use as a contact. Such a metal fill material can be deposited, for example, by CVD or any other suitable metal deposition technique.

Figure 13A:
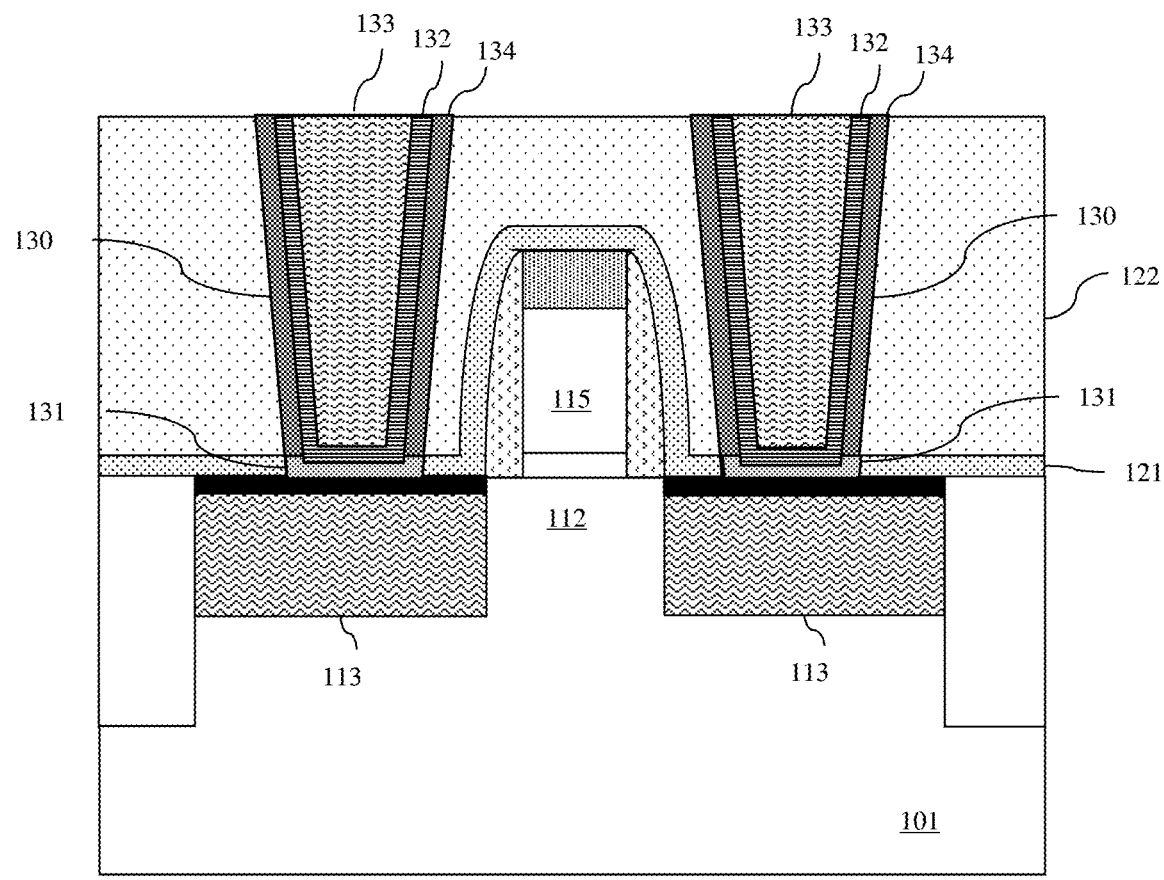
FIGS. 13A and 13B are a cross-section diagram and a top view diagram, respectively, illustrating an exemplary partially completed IC structure formed according to the flow diagram of FIG. 5.
Figure 13B:
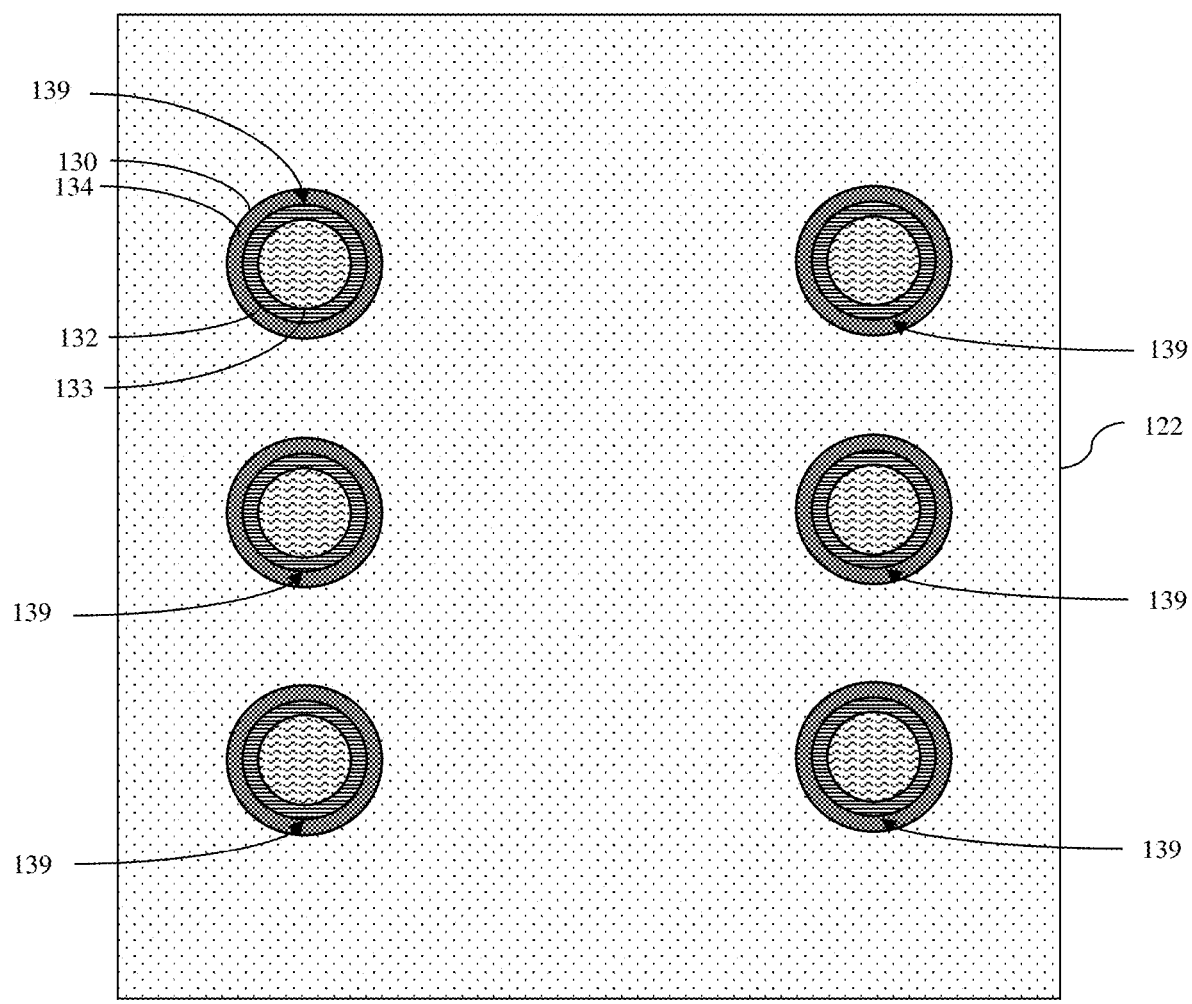

Following deposition of the metal fill material 133, a polishing process (e.g., a CMP process) can be performed in order to remove the adhesive layer, the conductive barrier layer (if present), and the metal fill material from above the top surface of the dielectric layer 122 (see process step 522 and FIGS. 13A-13B). It should be noted that this CMP process can also be performed so that it exposes, at the top of each contact opening 130: (a) the top surface of a completed contact 139 including the top surface of the metal fill material 133 (as mentioned above the metal fill material 133 can be centered within the contact opening 130) and, if applicable, the top end of a conductive barrier layer 132 (as mentioned above each contact 139 can also include a conductive barrier layer 132 wrapped around and immediately adjacent to bottom and side surfaces of the metal fill material 133); and (b) the top end of the adhesive layer 131 (as mentioned above, the adhesive layer 131 is immediately adjacent to the sidewall(s) and bottom surface of the contact opening 130 so as to be wrapped around the bottom and side surfaces of the contact 130 and it may also include an oxidized portion 134 on the sidewall(s) within the upper section of the contact opening due to heat treatment at process step 516) (e.g., as shown in the top view diagram of FIG. 13B).

Figure 14A:
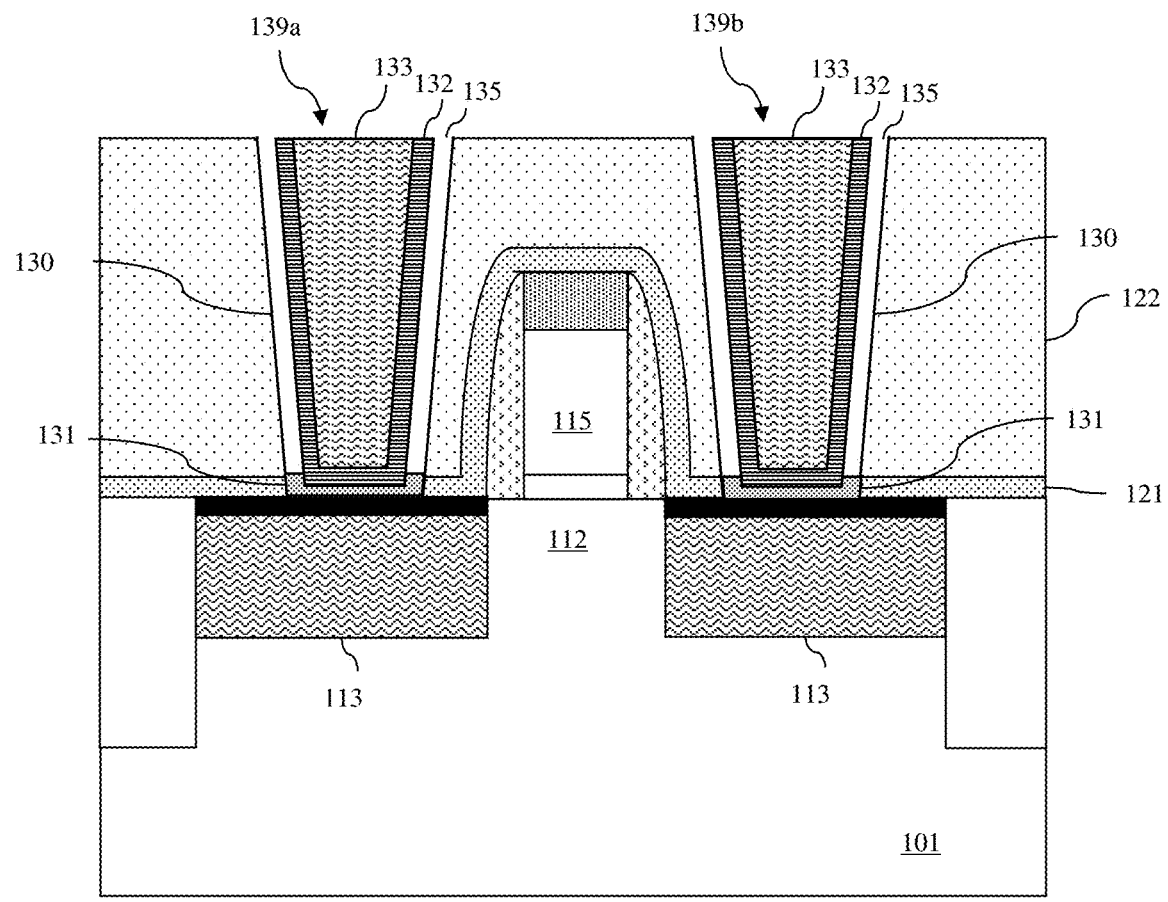
FIGS. 14A and 14B are vertical and horizontal cross-section diagrams, respectively, illustrating an exemplary partially completed IC structure formed according to the flow diagram of FIG. 5.
Figure 14B:
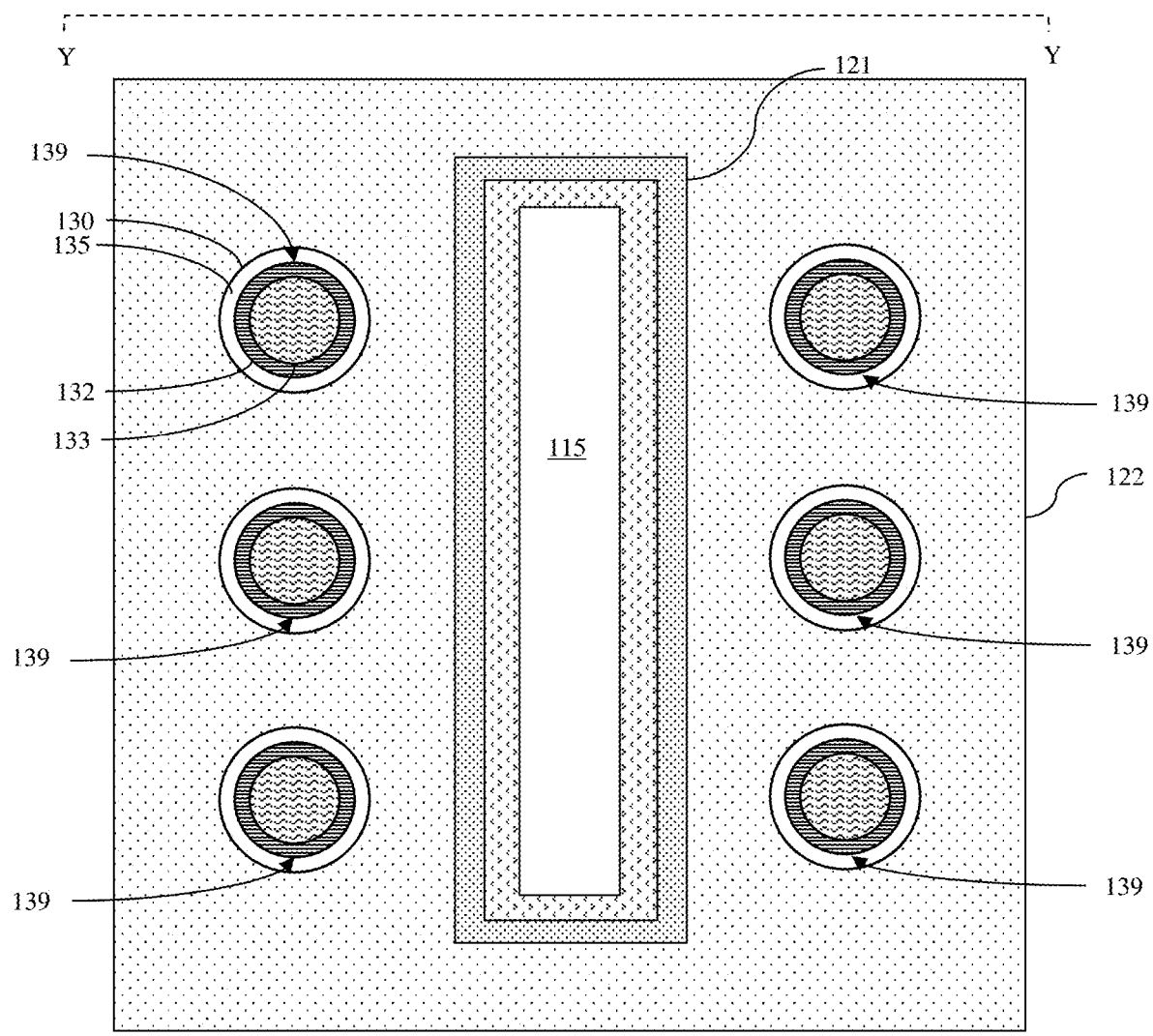

The exposed top end of the adhesive layer 131 can then be selectively etched back (i.e., selectively recessed or selectively removed) to form a gap 135 (see process step 524 and FIGS. 14A-14B). For example, if the exposed top end of the adhesive layer and, particularly, the portion of the adhesive layer 131 positioned laterally adjacent to the sidewall(s) of the upper section of the contact opening 130 within the dielectric layer 122 has been oxidized (e.g., into titanium oxide), then a selective etch process can be performed and this selective etch process can specifically be selective for the oxidized adhesive material over the pure adhesive material (e.g., titanium) and further over the other exposed materials (e.g., over the dielectric material of the dielectric layer 122, over the barrier material of the conductive barrier layer 132; and over the metal fill material 133). In one exemplary embodiment the selective etch process can employ both diluted hydrofluoric acid (DHF) and ammonium hydroxide (NH$_4$OH) to selectively etch away exposed titanium oxide from the upper section of each contact opening 130, stopping on the remaining titanium in the lower section of each contact opening without significantly etching exposed surfaces of BPSG (e.g., of the dielectric layer 122) or tungsten (e.g., of the metal fill material 133). As a result of this selective etch process, a gap 135 will wrap laterally around each contact 139 (e.g., see FIG. 14B) and will have essentially the same thickness as the adhesive layer 131 (e.g., 5-20 nm). As mentioned above, for purposes of this disclosure, a "gap" refers to a space, which separates the identified components (i.e., the sidewall(s) of a contact opening 130 and the contact 139 contained within the contact opening 130) and which is not filled by solid or liquid material.

Subsequently, a relatively thin additional dielectric layer 123 can be formed on the top surface of the dielectric layer 122 so as to cover the partially completed structure (see process step 526 and FIG. 1A). This additional dielectric layer 123 can be another etch stop layer (e.g., a SiN layer, a SiCN layer, etc.) and can be deposited, for example, by chemical vapor deposition (CVD), atomic layer deposition (ALD) or by any other suitable thin film conformal deposition technique. Furthermore, because each previously formed gap 135 is relatively narrow (e.g., 5-20 nm), this additional dielectric layer 123 will pinch off at the top of the gap 135 during deposition and, thus, will cap (i.e., close off, encapsulate, etc.) the gap 135 within its corresponding contact opening.

Depending upon the processing specifications employed during deposition of the additional dielectric layer 123 as well as the ambient environment within which the additional dielectric layer 123 is deposited, capping of a gap within a contact opening will result in the gap being characterized by an ultralow-K dielectric constant (e.g., K<1.1) (i.e., will result in the gap being an ultralow-K dielectric-gap). For example, the ULK dielectric-gap could be an air-filled gap (also referred to herein as an air-gap). Those skilled in the art will recognize that "air" has a dielectric constant of approximately 1 and typically refers to a mixture of gases that include nitrogen, oxygen, argon, carbon dioxide, water vapor, etc. and, possibly, also dust or other particles. Alternatively, the ULK dielectric-gap could be a gas-filled gap, which is filled with different gaseous material(s) than air and which still has a dielectric constant of less than 1.1. Such a gas-filled gap can, for example, be filled with a single relatively pure gas or, alternatively, some mixture of one or more gases with or without dust or other particles. Alternatively, the ULK dielectric-gap can be a void or, more particularly, a gap that is not filled with material but instead devoid of matter (i.e., a space under vacuum). In any case, such a ULK dielectric-gap 135 can wrap laterally around the contact 139 within the contact opening 130 so that it is between the contact 139 and the sidewall(s) of the contact opening 130. Thus, the contacts 139 are also referred to herein as ULK dielectric-gap wrapped contacts or ULK dielectric-gap cladded contacts.

The method can further include performing conventional back-end-of-the-line (BEOL) metal level processing in order to complete the IC structure (see process step 528). The BEOL processing can include forming, within the BEOL metal levels, vias and/or wires to electrically connect the device 110 to another on-chip device or to an off-chip structure through the air-gap wrapped contact(s) 139.

It should be understood that in the embodiments of the structure and of the method described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a device;
    a dielectric layer on the device, wherein an opening extends through the dielectric layer; and
    a contact within the opening and electrically connected to the device,
    wherein the opening has sidewalls and a bottom surface, and
    wherein the contact includes:
        an adhesive layer covering at least the bottom surface of the opening; and
        a metal fill material structure and a conductive barrier layer above the adhesive layer, wherein the metal fill material structure is separated from the sidewalls of the opening by the conductive barrier layer and an ultralow-K dielectric-gap, and wherein portions of the adhesive layer extend laterally beyond the metal fill material structure below the ultralow-K dielectric gap to the sidewalls.

2. The structure of claim 1, wherein, within the opening, the ultralow-K dielectric-gap wraps laterally around the metal fill material structure and comprises any of an air-gap, a gas-filled gap, and a void.

3. The structure of claim 1, wherein the metal fill material structure includes any of tungsten and cobalt.

4. The structure of claim 1, wherein the metal fill material structure has a top, a bottom and side surfaces, wherein the conductive barrier layer is immediately adjacent to and between the adhesive layer and the bottom and further extends upward from the bottom along the side surfaces to the top, and wherein the ultralow-K dielectric gap is positioned laterally between the conductive barrier layer and the sidewalls of the opening.

5. The structure of claim 1, further comprising an etch stop layer between the device and the dielectric layer,
    wherein the etch stop layer comprises a first dielectric material and the dielectric layer comprises a second dielectric material that is different from the first dielectric material,
    wherein the opening further extends through the etch stop layer such that the opening has a lower section within the etch stop layer and an upper section above the lower section and within the dielectric layer, and
    wherein the adhesive layer is at least within the lower section stacked between the device and the metal fill material structure.

6. The structure of claim 1, wherein the adhesive layer is above and immediately adjacent to a metal silicide layer below the opening and wherein the adhesive layer includes a conductive metal or metal alloy layer different from the metal silicide layer and from the conductive barrier layer.

7. The structure of claim 5,
    wherein the etch stop layer comprises silicon nitride,
    wherein the dielectric layer comprises borophosphosilicate glass, and
    wherein the adhesive layer comprises titanium.

8. The structure of claim 1, further comprising an additional dielectric layer on the dielectric layer, wherein the ultralow-K dielectric-gap is capped by the additional dielectric layer.

9. A structure comprising:
    a transistor comprising:
        source/drain regions and a channel region positioned laterally between the source/drain regions; and
        a gate structure adjacent to the channel region;
    a dielectric layer on the transistor, wherein the dielectric layer has openings aligned above the source/drain regions and extending through the dielectric layer; and
    contacts within the openings and electrically connected to the source/drain regions,
    wherein each opening has sidewalls and a bottom surface, and
    wherein each contact within each opening includes:
        an adhesive layer covering at least the bottom surface of the opening; and
        a metal fill material structure and a conductive barrier layer above the adhesive layer, wherein the metal fill material structure is separated from the sidewalls of the opening by the conductive barrier layer and an ultralow-K dielectric-gap, and wherein portions of the adhesive layer extend laterally beyond the metal fill material structure below the ultralow-K dielectric gap to the sidewalls.

10. The structure of claim 9, wherein, within each opening, the ultralow-K dielectric-gap wraps laterally around the metal fill material structure and comprises any of an air-gap, a gas-filled gap, and a void.

11. The structure of claim 9, wherein the metal fill material structure includes any of tungsten and cobalt.

12. The structure of claim 9, wherein, in each contact, the metal fill material structure has a top, a bottom and side surfaces and the conductive barrier layer is immediately adjacent to and between the adhesive layer and the bottom and further extending upward from the bottom along the side surfaces to the top, and wherein the ultralow-K dielectric gap is positioned laterally between the conductive barrier layer and the sidewalls of the opening.

13. The structure of claim 9, further comprising an etch stop layer between the transistor and the dielectric layer,
wherein the etch stop layer comprises a first dielectric material and the dielectric layer comprises a second dielectric material that is different from the first dielectric material,
wherein the openings further extend through the etch stop layer such that each opening has a lower section within the etch stop layer and an upper section above the lower section and within the dielectric layer, and
wherein the adhesive layer of each contact is at least within the lower section of each opening stacked between a source/drain region and the metal fill material structure.

14. The structure of claim 13,
wherein the etch stop layer comprises silicon nitride,
wherein the dielectric layer comprises borophosphosilicate glass, and
wherein the adhesive layer comprises titanium.

15. The structure of claim 9, further comprising an additional dielectric layer on the dielectric layer, wherein all ultralow-K dielectric-gaps are capped by the additional dielectric layer.

16. A method comprising:
forming a device on a substrate;
forming a dielectric layer on the device;
forming an opening that extends through the dielectric layer, wherein the opening has sidewalls and a bottom surface; and
forming a contact within the opening such that the contact is electrically connected to the device and such that the contact includes:
an adhesive layer covering at least the bottom surface; and
a metal fill material structure and a conductive barrier layer above the adhesive layer, wherein the metal fill material structure is separated from the sidewalls of the opening by the conductive barrier layer and an ultralow-K dielectric-gap, and wherein portions of the adhesive layer extend laterally beyond the metal fill material structure below the ultralow-K dielectric gap to the sidewalls.

17. The method of claim 16, wherein the forming of the contact comprises:
lining the opening with the adhesive layer;
depositing a metal fill material into the opening;
exposing a top surface of the dielectric layer and a top end of the adhesive layer between the dielectric layer and the metal fill material within the opening;
etching back the top end of the adhesive layer to form a gap such that, within the opening, the gap wraps laterally around the metal fill material; and
depositing an additional dielectric layer on the dielectric layer, wherein the additional dielectric layer caps the gap such that the gap comprises an ultralow-K dielectric-gap comprising any of an air-gap, a gas-filled cap, and a void.

18. The method of claim 17,
wherein the forming of the contact further comprises, between the lining of the opening with the adhesive layer and the depositing of the metal fill material, depositing the conductive barrier layer on the adhesive layer, and
wherein, after the depositing of the metal fill material, the conductive barrier layer is immediately adjacent to and between the adhesive layer and a bottom of the metal fill material and further extends upward from the bottom along side surfaces of the metal fill material to a top of the metal fill material and the ultralow-K dielectric gap is positioned laterally between the conductive barrier layer and the sidewalls of the opening.

19. The method of claim 17, further comprising: between the forming of the device and the forming of the dielectric layer, forming an etch stop layer on the device,
wherein the etch stop layer comprises a first dielectric material and the dielectric layer comprises a second dielectric material that is different from the first dielectric material,
wherein the opening is formed so as to extend through the dielectric layer and the etch stop layer such that a lower section of the opening is within the etch stop layer and an upper section of the opening is above the lower section and within the dielectric layer, and
wherein the top end of the adhesive layer is etched back so as to leave a remaining portion of the adhesive layer between the device and the metal fill material and extending laterally beyond the metal fill material with an outer edge of the remaining portion being aligned below the gap.

20. The method of claim 19,
wherein the dielectric layer is an oxygen-containing dielectric layer,
wherein the etch stop layer is a non-oxygen containing dielectric layer,
wherein the method further comprises causing a portion of the adhesive layer in contact with the dielectric layer to become an oxidized portion, and
wherein the etching back of the top end of the adhesive layer comprises removing the oxidized portion.

* * * * *